US011962079B1

(12) United States Patent
Sechrist et al.

(10) Patent No.: US 11,962,079 B1
(45) Date of Patent: Apr. 16, 2024

(54) RADIO FREQUENCY SIGNALS DETECTION SYSTEMS

(71) Applicant: The United States of America, as represented by the Secretary of the Navy, Arlington, VA (US)

(72) Inventors: Zachary A. Sechrist, Alexandria, VA (US); Christopher G. Yelton, Ridgecrest, CA (US); Mark B. Moran, Ridgecrest, CA (US); Linda F Johnson, Ridgecrest, CA (US); Joseph E. Estevez, Ridgecrest, CA (US); Gretchen H. Hefley, Ridgecrest, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 340 days.

(21) Appl. No.: 17/583,736

(22) Filed: Jan. 25, 2022

(51) Int. Cl.
*H01Q 1/38* (2006.01)
*G01R 29/08* (2006.01)
*H01Q 13/02* (2006.01)

(52) U.S. Cl.
CPC .............. *H01Q 1/38* (2013.01); *G01R 29/08* (2013.01); *H01Q 13/02* (2013.01)

(58) Field of Classification Search
CPC ........ H01Q 1/38; H01Q 13/02; H01Q 1/2283; H01Q 1/48; H01Q 21/0025; H01Q 1/02; H01Q 21/065; H01Q 1/08; H01Q 1/286; H01Q 1/288; H01Q 21/061; H01Q 9/0407; H01Q 21/0093; H01Q 1/243; H01Q 3/36; H01Q 1/523; H01Q 1/50; H01Q 23/00; H01Q 3/26; H01Q 5/378; H01Q 1/246; H01Q 19/005; H01Q 21/0075; H01Q 25/00; H01Q 3/38; H01Q 3/40; H01Q 1/24; H01Q 1/40; H01Q 1/526; H01Q 21/08; H01Q 1/00; H01Q 1/285; H01Q 11/02; H01Q 21/00; H01Q 21/062; H01Q 21/10; H01Q 21/24; H01Q 21/293; H01Q 3/2676; H01Q 3/46; H01Q 5/42; G01R 29/08
See application file for complete search history.

(56) References Cited

U.S. PATENT DOCUMENTS

| | | | | |
|---|---|---|---|---|
| 7,061,431 | B1* | 6/2006 | Tonn | H01Q 9/0442 343/700 MS |
| 2015/0323576 | A1* | 11/2015 | Bulja | G01R 27/06 324/638 |
| 2017/0311466 | A1* | 10/2017 | Memering | H05K 5/03 |
| 2018/0253002 | A1* | 9/2018 | Shi | G03F 7/0005 |
| 2020/0076031 | A1* | 3/2020 | Nam | H04B 15/04 |

* cited by examiner

*Primary Examiner* — Alvaro E Fortich
(74) *Attorney, Agent, or Firm* — Naval Air Warfare Center Weapons Division; James M. Saunders

(57) ABSTRACT

The embodiments include an array in intimate adjacent contact with a substrate foundation. The array has a plurality of radio frequency (RF) witness films overlain on the substrate foundation. Each RF witness film is a unit cell defined in a three-dimensional coordinate frame of reference, and is centered at an origin of the three-dimensional coordinate frame of reference. Each RF witness film in the plurality of RF witness films is equally-spaced from adjacent RF witness films.

18 Claims, 10 Drawing Sheets

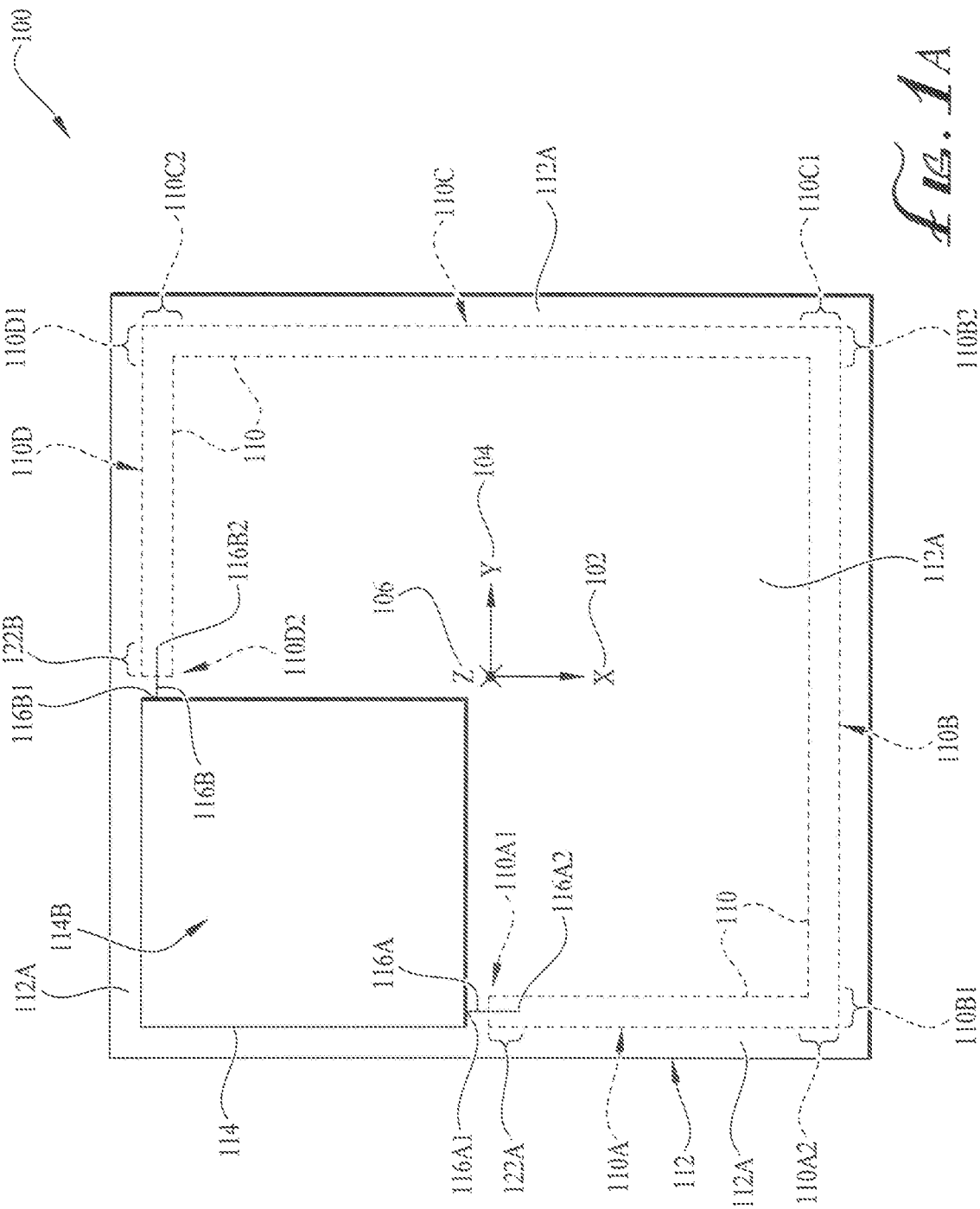

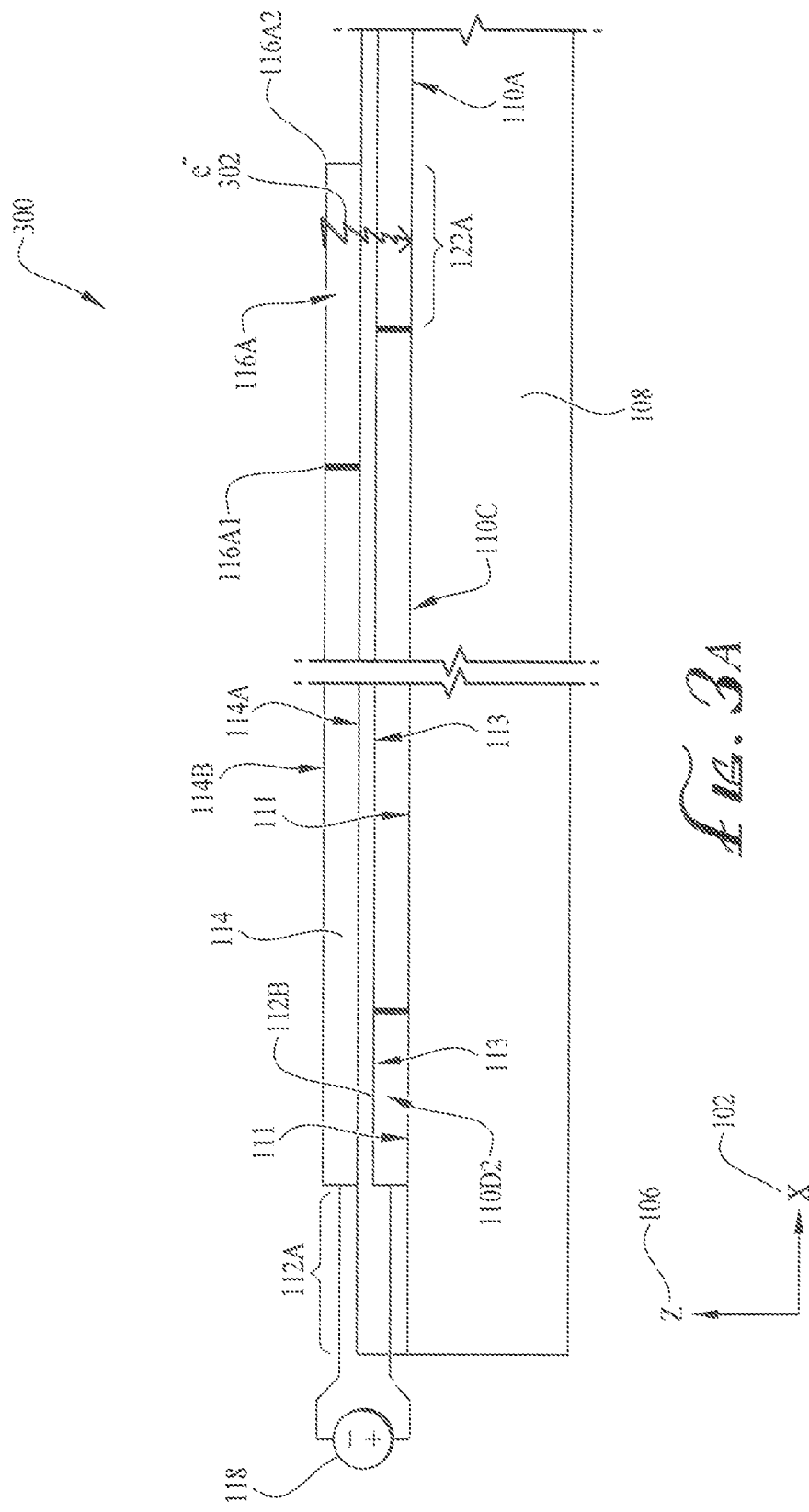

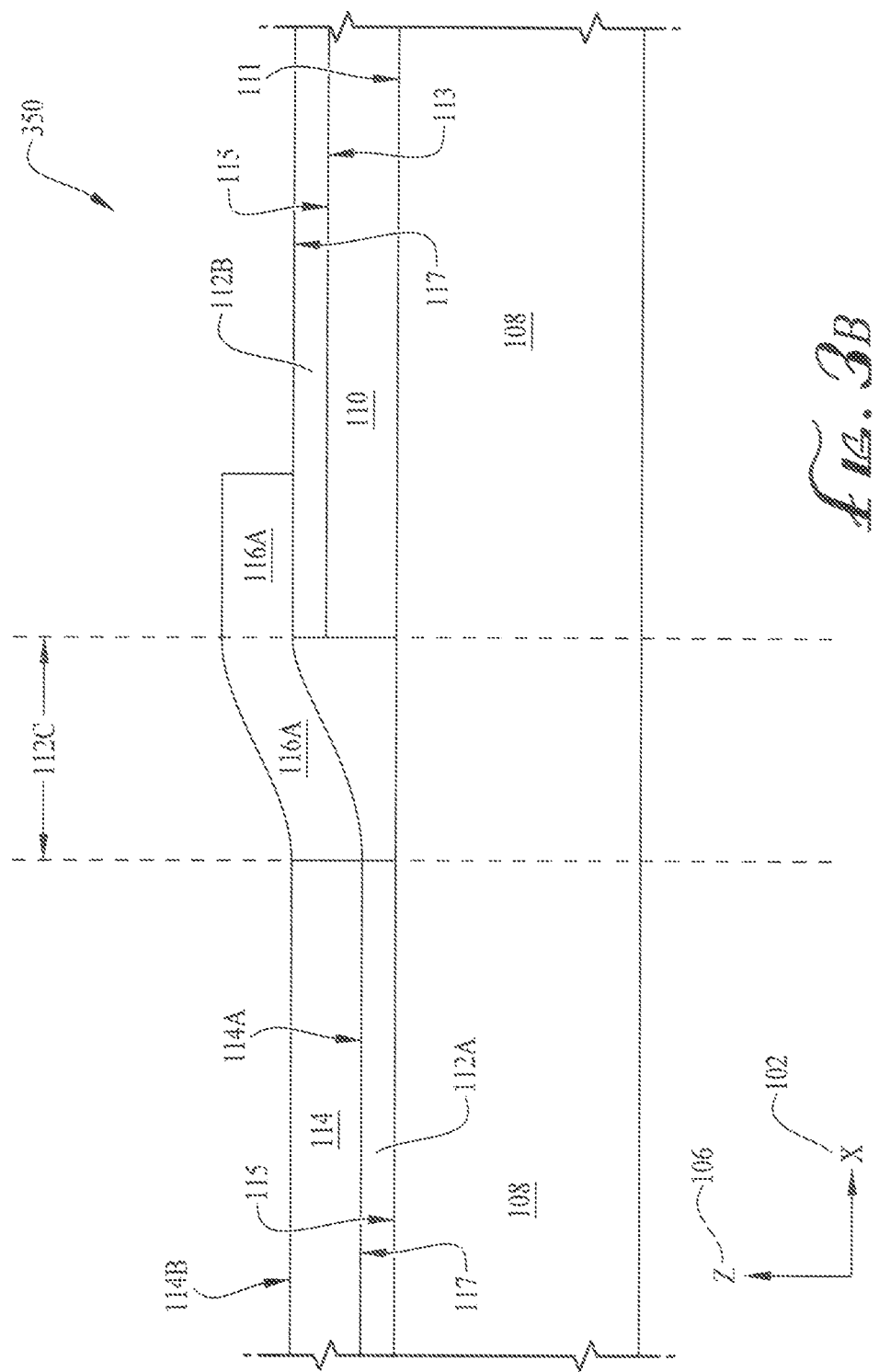

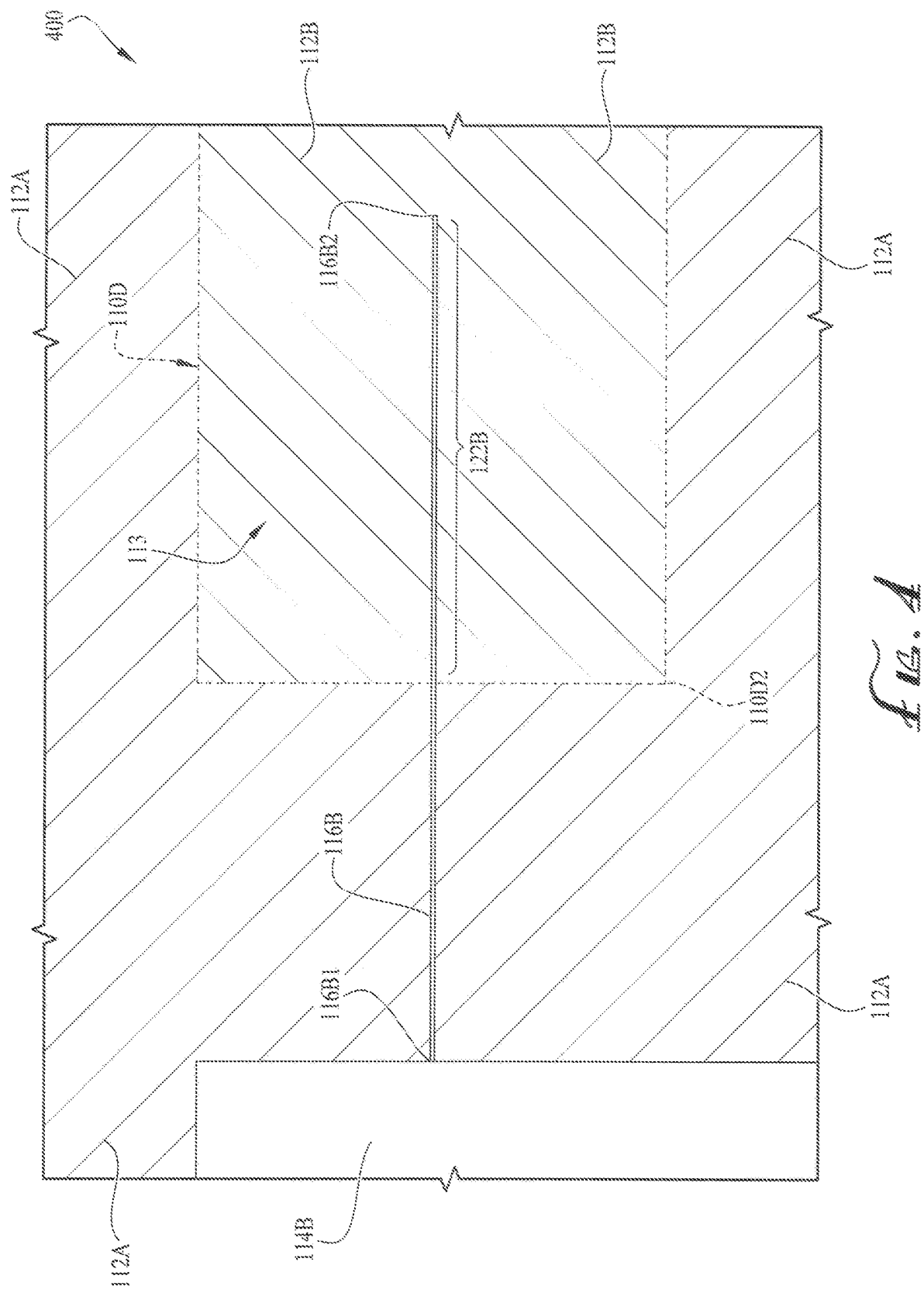

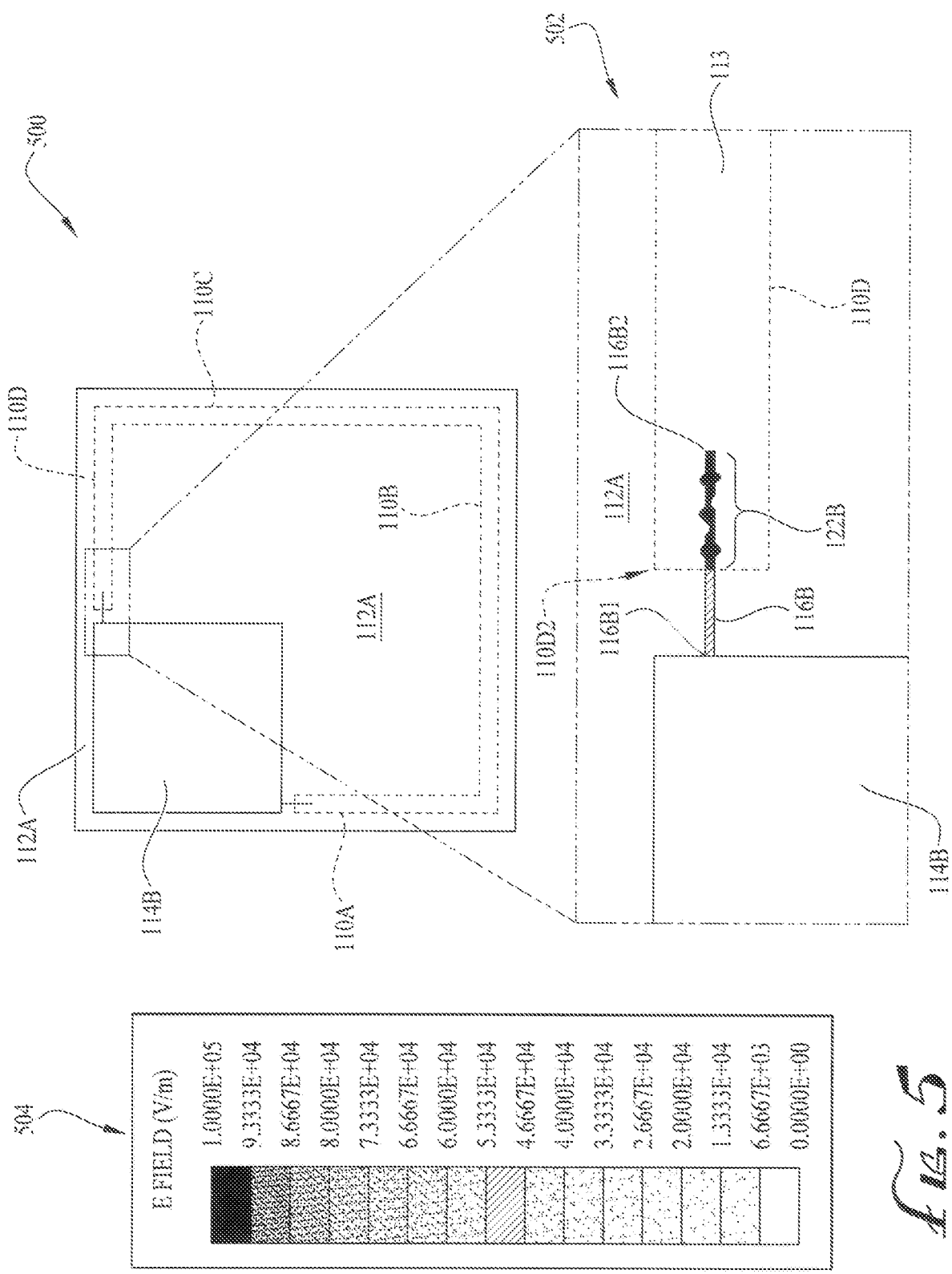

RADIO FREQUENCY SIGNALS DETECTION SYSTEMS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor. The subject matter of this invention is related to work conducted under Navy contract N0001416WX00035.

FIELD

Embodiments generally relate to sensors.

BRIEF DESCRIPTION OF THE DRAWINGS

FIG. 1A illustrates a plan view of a radio frequency (RF) witness film, sometimes referred to as a unit cell, according to some embodiments.

FIG. 3A illustrates a partial side view along the y-axis for the area delineated in FIG. 1B.

FIG. 3B illustrates a close-up partial side view along the y-axis for the area delineated in FIG. 1B.

FIG. 4 illustrates a close-up view of a portion of the plan view of FIG. 1B, including a microstrip extension and overlap region, according to some embodiments.

FIG. 5 illustrates a simulated electric field distribution in the RF witness film in FIG. 1B.

Figure 1B:
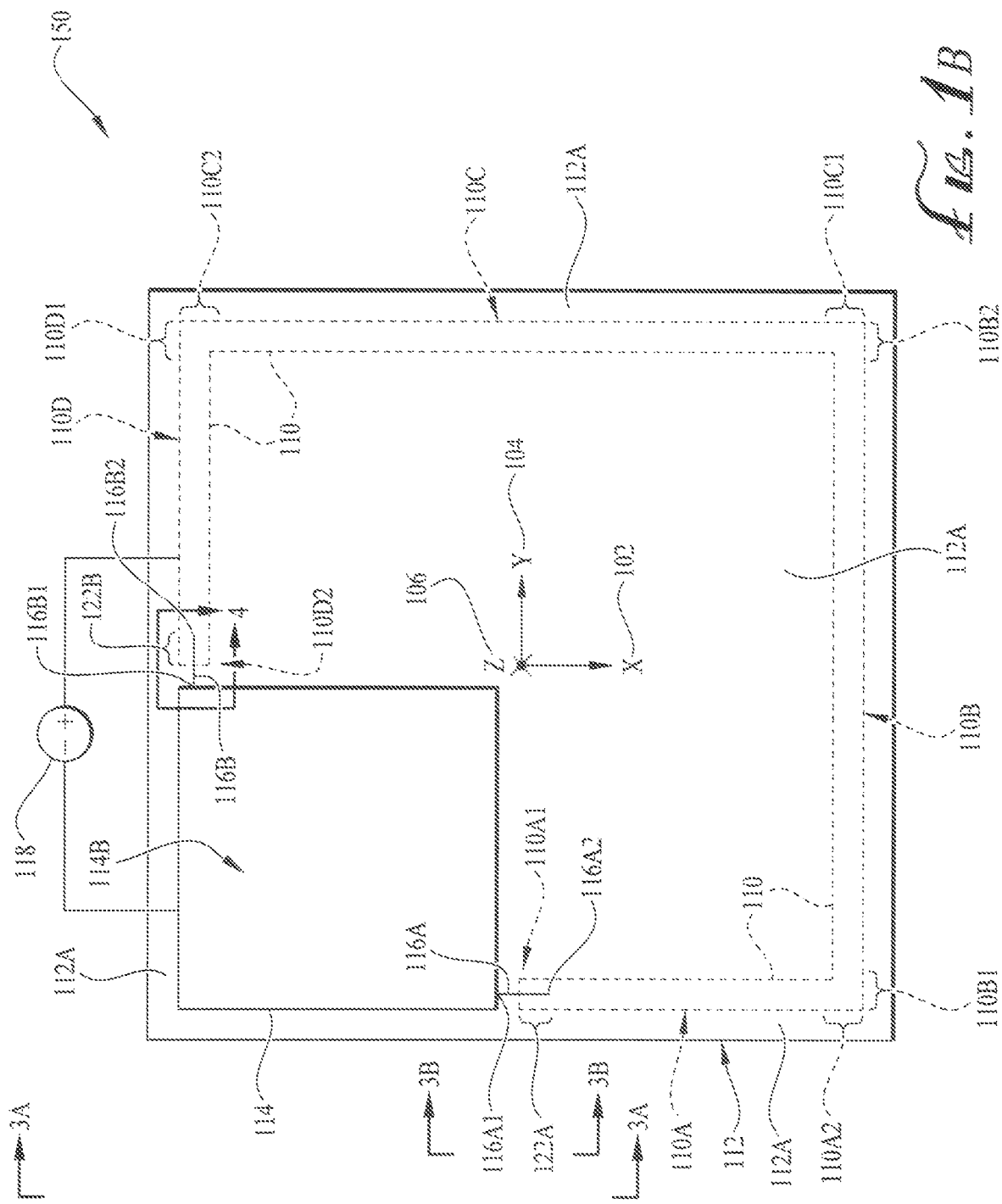
FIG. 1B illustrates a plan view of the unit cell and a direct current offset voltage, according to some embodiments.

It is to be understood that the foregoing general description and the following detailed description are exemplary and explanatory only and are not to be viewed as being restrictive, as claimed. Further advantages will be apparent after a review of the following detailed description of the disclosed embodiments, which are illustrated schematically in the accompanying drawings and in the appended claims.

DETAILED DESCRIPTION OF EMBODIMENTS

Embodiments may be understood more readily by reference in the following detailed description in connection with the accompanying figures and examples. It is understood that embodiments are not limited to the specific devices, methods, conditions or parameters described and/or shown herein, and that the terminology used herein is for the purpose of describing particular embodiments by way of example only and is not intended to be limiting of the claimed embodiments.

The embodiments generally relate to a device that senses when electromagnetic energy is imparted on the device's surface. The device, in particular, is configured as a single or multiple radio frequency witness films to create an awareness that a change in electromagnetic energy occurred at the device.

Although the embodiments are described in considerable detail, including references to certain versions thereof, other versions are possible. Examples of other versions include varying component orientation or hosting embodiments on different platforms. Therefore, the spirit and scope of the appended claims should not be limited to the description of versions included herein.

Conventions, Parameters, and Terminology

At the outset, it is helpful to describe various conventions, parameters, and terminology associated with the embodiments.

Electron Tunneling

The embodiments make use of "electron tunneling." A person having ordinary skill in the art will recognize that electron tunneling is a phenomenon between two metal layers in such fashion that electrons pass from one metal layer, through a layer that electrons normally will not travel, such as a dielectric layer 112 or insulator, and then into a second metal layer. The embodiments and accompanying figures use electron tunneling to detect the intensity of radio frequency signals and various directed energy emissions on structures disclosed in the embodiments. The embodiments are novel for several reasons, including their use of electron tunneling to create an awareness that a change in electromagnetic energy occurred. The term "tunneling current" is sometimes used interchangeably herein for the electron tunneling.

Sputter Deposition

Various layered structures are used to construct the embodiments. One technique used is "sputter deposition." Sputter deposition is understood by one having ordinary skill in the art to be a physical vapor deposition method of thin film deposition by sputtering. Radio frequency (RF) sputtering was also used. A person having ordinary skill in the art will recognize that RF sputtering is used in environments where the sign of the anode-cathode bias is varied at a high rate, such as environments greater than 13 MHz.

Spin Coating

The embodiments also employed "spin coating" techniques. Spin coating is understood to be a procedure to deposit uniform thin film materials onto generally flat substrates. A person having ordinary skill in the art will recognize that spin coating can include spinning a substrate layer at high angular velocities. In particular, the technique is used to deposit photoresist layers.

Sigmoid Shape

The embodiments include geometrical arrangements and shapes of components. In particular, some embodiments describe a dielectric layer (shown as reference character 112 in the figures) as having a sigmoid shape. A person having ordinary skill in the art will understand that the dielectric layer 112 has surface contours having a "sigmoid" shape or ogee shape. Additionally, a person having ordinary skill in the art will recognize that ogee is a type of sigmoid shape. It is understood in the art that a sigmoid shape is a shape similar to the letter S. Likewise, an ogee shape is understood to be descriptive of an S-shape and, moreover, is characteristic of two curves meeting at a point.

Substantially

As used herein, unless otherwise specified, the term "substantially" refers to the complete, or nearly complete, extent or degree of an action, characteristic, property, state, structure, item, or result. As an arbitrary example, an object that is "substantially" surrounded would mean that the object is either completely surrounded or nearly completely surrounded. The exact allowable degree of deviation from absolute completeness may in some cases depend on the specific context. However, generally speaking, the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As another arbitrary example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

Electromagnetic Energy

As used herein, the term "electromagnetic energy," sometimes referred to as "electromagnetic radiation," and similar terms, refers to energy emanating from oscillation of transverse electric and magnetic fields. Electromagnetic radiation is generally characterized by a wave of disturbance of wavelength, λ, which is the distance between peaks of the wave for a given frequency, which may be the number of occurrences the wave returns to its original displacement per unit time as it passes a fixed point. The velocity of a radiating electromagnetic wave is the speed of light, c, which is related the wavelength and frequency according to c=lambda*f. Electromagnetic radiation may include, without limitation, electromagnetic fields and electromagnetic signals such as radar transmit and receive signals.

Apparatus, System, and Method
Embodiments—FIGS. 1A through 4, and 6

In the accompanying drawings, like reference numbers indicate like elements. For all embodiments and figures, it is understood that the figures are not to scale and are depicted for ease of viewing. Reference characters 100, 150, 600, and 601 depict various embodiments, sometimes referred to as mechanisms, apparatus, devices, systems, and similar terminology. Several views are presented to depict some, though not all, of the possible orientations of the embodiments.

FIG. 1A depicts a plan view of a radio frequency (RF) witness film 100. The RF witness film 100 can also be referred to as an apparatus, a sensor, a unit cell, a single unit cell, an RF witness film unit cell, a unit cell sensor, and similar terminology. In particular, because FIG. 1A depicts a single RF witness film 100, the unit cell terminology is used interchangeably. The unit cell 100 is substantially-square in plan view and is defined in a three-dimensional coordinate frame of reference defined by an x-axis 102, a y-axis 104, and a z-axis 106, with the unit cell 100 centered at the origin.

Figure 2:
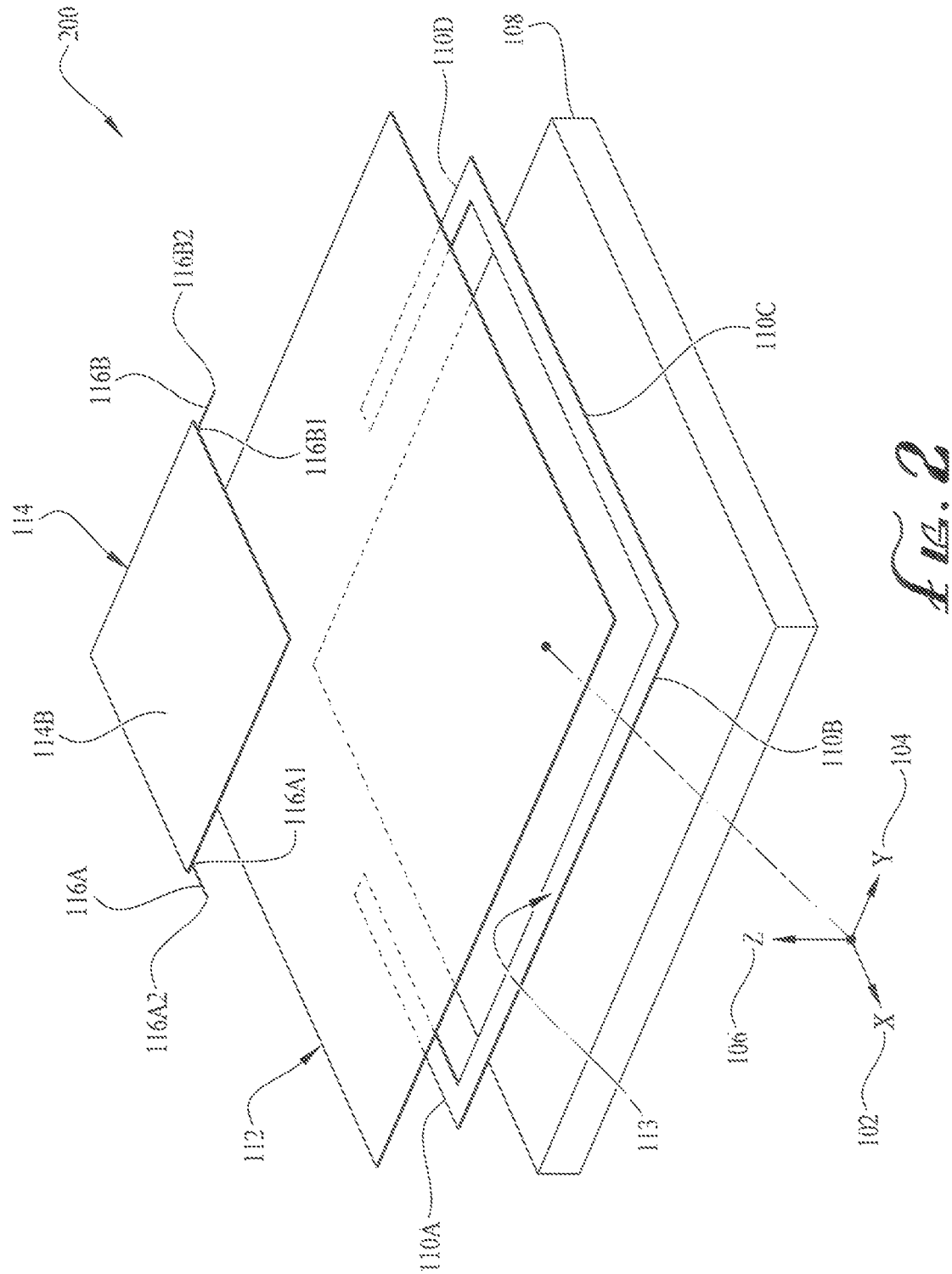
FIG. 2 illustrates an isometric assembly view of the RF witness film depicted in FIG. 1A.

FIG. 1B shows a plan view, depicted by reference character 150, of the RF witness film 100 from FIG. 1A with an optional direct current (DC) offset voltage source 118. FIG. 2 shows an isometric assembly view, depicted with reference character 200, of the unit cell 100 from FIG. 1A. FIG. 2 is especially useful in viewing the layer-by-layer components used to construct the unit cell/RF witness film 100. Reference character 300 is used to depict the partial side view in FIG. 3A. The partial side view 300 shows the unit cell 100 looking into the page, along the y-axis 104, for the area delineated in FIG. 1B. Reference character 350 depicts a close-up partial side view of the unit cell 100 looking into the page, along the y-axis 104, for the area delineated in FIG. 1B. Referring to FIGS. A through 3B is helpful in identifying the various features. As shown in FIG. 3A, the unit cell 100 is generally constructed of substantially-flat layers, with some variation due to deposition and when viewed closely as shown in FIG. 3B.

Referring to the FIGS. 1A, 1B, and 3A, the unit cell 100 has a substrate 108 (visible in FIG. 3A). A first conductor 110, sometimes referred to as a first conductive layer or first metal layer, is in intimate adjacent contact with the substrate 108. Additional substrate 108 material is shown on the outside edges of the unit cell which provides stability during layer deposition. An insulator 112, also referred to as a dielectric and dielectric layer, has two portions—a first portion 112A and a second portion 112B. The first portion 112A is in intimate adjacent contact with the substrate 108. The second portion 112B is in intimate adjacent contact with the first conductive layer 110. Reference character 112 is used when referring generally to the dielectric layer, such as in the isometric assembly view in FIG. 2. However, most instances refer to the first and second portions 112A and 112B in describing structural features.

A second conductor 114, also referred to as a conductive layer and second metal layer, has a first side 114A and a second side 114B, with the first side being in intimate adjacent contact with the first portion 112A of the dielectric layer 112. Reference character 114 is used when referring generally to the second conductive layer 114, such as in FIGS. 1A through 2. However, many instances refer to the first and second sides 114A and 114B to describe structural features. The second conductive layer 114 has at least two microstrip extensions, referred to as first microstrip extension 116A and a second microstrip extension 116B (viewable in FIGS. 1A, 1B, and 2) perpendicular to each other in the x-y plane. FIG. 3A only depicts the first microstrip 116A for ease of viewing. FIG. 1B includes an optional direct current (DC) offset voltage 118, commonly referred to as a DC battery, or DC power source. The DC offset voltage 118 is electrically-connected between the first and second conductive layers 110 and 114, respectively. The DC offset voltage 118 is used to adjust the sensitivity of the RF witness film 100 and get closer to breakdown conditions.

The first conductive layer 110 has four strip segments—first, second, third, and fourth strip segments 110A, 110B, 110C, and 110D, respectively. The four strip segments 110A through 110D, can sometimes be referred to as "strips," "segments," and the like without detracting from the merits or generalities of the embodiments. The four strip segments 110A through 110D form an incomplete square outline that is about three-quarters of a square strip outline in the x-y plane—sometimes also referred to as three-quarters of one square strip outline, and similar variations without detracting from the merits or generalities of the embodiments. As shown in FIGS. 1A through 2, the four strip segments 110A through 110D are located near the outer edges of the unit cell 100.

Stated another way, the segments 110A through 110D can be viewed as spatially-covering three quadrants in the x-y plane of the unit cell 100, which is especially visible in FIGS. A and 1B depicting the x-y plane. Reference character 111 is used for ease of viewing to represent the first side of the four strip segments 110A through 110D. Similarly, reference character 113 is used for ease of viewing to depict the second side of the four strip segments 110A through 110D. It is evident that the first side 111 of each of the four strip segments 110A through 110D is in intimate adjacent contact with the substrate 108.

It is apparent that the dielectric's first portion 112A is an area adjacent to, and defined by, the first through fourth strip segments 110A through 110D, and also interior to, i.e. towards the origin in the x-y plane. The first portion 112A then spans parallel to, i.e. has a thickness in the z-axis 106 direction, from the substrate 108 to the first side 114A of the second conductive layer 114. Additionally, the dielectric layer's second portion 112B is an area in intimate adjacent contact with, and defined by, each of the second sides 113 of the first through fourth strip segments 110A through 110D in the x-y plane. Thus, the second portion 112B of the dielectric layer 112 is overlain and in intimate adjacent contact with each of the second sides 113 of the first through fourth strip segments 110A through 110D. The second portion 112B then spans parallel to, i.e. has a thickness in the z-axis 106 direction, to the elevation of the first side 114A of the second conductive layer 114. In layman's terms, the second portion 112B is the region in contact with the second sides 113 of the first through fourth strip segments 110A through 110D in the x-y plane and then spanning to the z-axis 106 elevation of the first side 114A of the second conductive layer 114.

Each of the four strip segments 110A through 110D have proximal and distal ends. For completeness, the first strip segment 110A has a proximal 110A1 and a distal end 110A2. The second strip segment 110B has a proximal 110B1 and a distal end 110B2. The third strip segment 110C has a proximal 110C1 and distal end 110C2. Finally, the fourth strip segment 110D has a proximal 110D1 and distal end 110D2.

The four strip segments 110A through 110D are adjacent to each other, with the exception of the first and fourth strip segments 110A and 110D, as shown on FIGS. 1A, 1B, and 2. With the exception of the first and fourth strip segments 110A and 110D, the previous strip segment's distal end is adjacent to the next strip segment's proximal end. In particular, the distal end 110A2 of the first strip segment 110A is adjacent to the proximal end 110B1 of the second strip segment 110B. The distal end 110B2 of the second strip segment 110B is adjacent to the proximal end 110C1 of the third strip segment 110C. Finally, the distal end 110C2 of the third strip segment 110C is adjacent to the proximal end 110D1 of the fourth strip segment 110D. For this purpose, the word "adjacent" is used to mean that the respective ends of the four strip segments 110A through 110D are joined as shown and described in the accompanying figures in such fashion that the first conductive layer 110 is one structure joined by four separate individual pieces bonded together, i.e. bonded segments, or in such fashion that the first conductive layer is simply four separate deposition strips, or one structure formed by integral segments. In either instance, and as shown in FIGS. 1A, 1B, and 2, the first through fourth strip segments 110A through 110D are consecutive segments that are perpendicular to their adjacent strip segments.

The first 110A and fourth 110D strip segments are not adjacent to each other, i.e. the distal end 110D2 of the fourth strip segment 110D is not adjacent to the proximal end 110A1 of the first strip segment 110A. However, it is evident from FIGS. 1A and 1B that a complete square outline is formed in the x-y plane when the second conductive layer 114 and its two microstrip extensions, i.e. first and second microstrip extensions 116A and 116B are included due to the second conductive layer and its first and second microstrip extensions forming a one-quarter of a square strip in the x-y plane.

The second 110B and third 110C strip segments are each one unit length in the x-y plane. The first 110A and fourth 110D strip segments are less than one unit length, with each being about one-half unit length. This geometry is what allows the combination of the second conductive layer 114 and microstrip extensions 116A and 116B to be about one-quarter of the square strip in the x-y plane. Stated another way, the microstrip extensions 116A and 116B spatially-extend in the x-y plane to form the complete square outline in the x-y plane with the proximal end 110A1 of the first strip segment 110A and the distal end 110D2 of the fourth strip segment 110D.

Both the first and second microstrip extensions (116A and 116B) are shown in FIGS. 1A, 1B, and 2, and form first 122A and second 122B overlap regions with the first 110A and fourth 110D strip segments, respectively. FIG. 3A also shows the first overlap region 122A. FIG. 4 shows a close-up view, depicted by reference character 400, of the second microstrip extension 116B and second overlap region 122B. Additionally, the first and second conductive layers 110 and 114, respectively, as well as the dielectric layer 112 are depicted.

The first microstrip extension 116A has a proximal end 116A1 adjacent to the second conductive layer 110 and a distal end 116A2. For ease of viewing, the proximal end 116A1 of the first microstrip extension 116A is shown as the junction of the first microstrip extension with the second conductive layer 114. Similarly, the second microstrip extension 116B has a proximal end 116B1 adjacent to the second conductive layer 114 and a distal end 116B2. For ease of viewing, the proximal end 116B1 of the second microstrip extension 116B is also shown as the junction of the second microstrip extension with the second conductive layer 114.

The first microstrip extension 116A and its distal end 116A2 extends outwardly away from the second conductive layer 114, parallel to the x-axis 102 and the first strip segment 110A. It is evident in FIGS. 1A, 1B, and 3A that the first overlap region 122A is the length of the first microstrip extension 116A between the proximal end 110A1 of the first strip segment 110A and the distal end 116A2 of the first microstrip extension. The first overlap region 122A then extends parallel to the Z-axis 106 from the first microstrip extension 116A through the dielectric layer 112 and through the thickness of the first conductive layer 110 and, specifically, the first strip segment 110A, and terminating at the first side of the first strip segment. One could also refer to the termination as occurring at the substrate 108.

The second microstrip extension 116B and its distal end 116B2 extend outwardly away from the second conductive layer 114, parallel to the y-axis 104 and the fourth strip segment 110D. It is very evident in the FIG. 4 close-up view that the second overlap region 122B is the length of the second microstrip extension 116B between the distal end 110D2 of the fourth strip segment 110D and the distal end 116B2 of the second microstrip extension. The second overlap region then extends parallel to the z-axis 106 from the second microstrip extension 116B through the dielectric layer 112 and through the thickness of the first conductive layer 110 and, specifically, the fourth strip segment 110D, and terminating at the first side 111 of the fourth strip segment. One could also refer to the termination as occurring at the substrate 108.

Thus, the first and second microstrip extensions (116A and 116B) form the first and second overlap regions 122A and 122B, respectively, by overlapping in the x-y plane, which is sometimes referred to as "spatially-overlapping," with respective ends of the first 110A and fourth 110D strip segments, as noted above. The overlap regions 122A and 122B are the regions where electron tunneling occurs, which allows electrons to pass to and fro between the microstrip extensions 116A and 116B and first conductive layer 110, through the dielectric layer 112. In this respect, the electron tunneling is from the second conductive layer 114 and, specifically, the first and second microstrip extensions 116A and 116B and through the dielectric layer 112 and then into the first conductive layer 110.

Therefore, the microstrip extensions 116A and 116B can also be referred to as electron tunneling inducement microstrip extensions and similar terminology. Electron tunneling is shown in FIG. 3A as a squiggly line 302 and sometimes designated by as "e⁻." As shown in FIG. 3A, electron tunneling 302 occurs in the first microstrip extension 116A in the first overlap region 122A vertically down the thickness of the second conductive layer 114 and, especially, the first microstrip extension, in the z-axis 106 direction and into and through the entire thickness of the dielectric layer 112, but especially the entire thickness of the first portion 112A of the dielectric layer. The electron tunneling 302, also shown in FIG. 3A, continues into the first conductive layer 110, and especially the first strip segment 110A, and then vertically down the thickness of first strip segment of the first conductive layer, and terminating at the substrate layer 108. It is evident when viewing FIG. 3B that the first overlap region 122A would also be viewable. However, for ease of viewing, FIG. 3B does not show the first overlap region 122A in order to focus on the conformal nature of the dielectric layer 112. As such, discussion regarding the first 122A and second 122B overlap regions and electron tunneling 302 in FIG. 3A is also applicable to FIG. 3B.

Generally Applicable to All Embodiments

Although thicknesses of various layers are given, they represent only one of several thickness examples. A person having ordinary skill in the art will recognize that other thicknesses can be used depending on application-specific conditions without detracting from the merits or generalities of the embodiments. The substrate 108 is glass or fused silica. The first conductive layer 110 and second conductive layer 114 are aluminum layers, with each layer having a 400 nanometers thickness. Each of the four strip segments 110A through 110D have a width in the x-y plane of 1 millimeter. The first and second portions 112A and 112B of the dielectric layer 112 are the same thickness, as measured in the z-direction. The thickness of the first portion 112A and the second portion 112B is 750 nanometers. The polymer used for the dielectric layer 112 is a negative photoresist polymer.

The first and second microstrip extensions 116A and 116B are aluminum having the same thickness (400 nanometers) as the thickness of the first and second conductive layers 110 and 114 in the embodiments. The respective layers—first conductive layer 110, dielectric layer 112, and second conductive layer 114—are substantially-flat thin films. As configured herein, each unit cell, i.e. RF witness film 100 is a capacitive structure. The intimate adjacent contact discussed earlier is by deposition techniques. In particular, sputter deposition and spin coating was used to construct the RF witness film 100 and array 601 embodiments. Moreover, the embodiments employed RF sputtering where the sign of the anode-cathode bias is varied at a high rate, such as in excess of 13 MHz.

The embodiments are constructed using two sputtering deposition phases and spin coating. Patterning using traditional photolithography methods was also used. In particular, the first conductive layer 110 was overlain over the substrate 108 using sputter deposition. The exact locations and shape of the four strip segments 110A through 110D forming the first conductive layer 110 was achieved by using photolithography patterning. The dielectric layer 112 was applied by spin coating. Thus, the first portion 112A of the dielectric 112 was applied by spin coating over the portion of the substrate 108 that is not covered by the four strip segments 110A through 110D. The second portion 112B of the dielectric 112 was also applied by spin coating over the four strip segments 110A through 110D. Finally, the second conductive layer 114 was applied over the dielectric layer 112 using sputter deposition. Photolithography patterning was used to form the shape of the second conductive layer 114 and the first 116A and second 116B microstrip extensions. For purposes herein, both the first 116A and second 116B microstrip extensions can be considered either separate from or integral with the second conductive layer 114. One having ordinary skill in the art will recognize that the various structural features can be constructed using other depositional methods than those mentioned without detracting from the merits or generalities of the embodiments.

It is evident when viewing FIG. 3B, which is a very close-up view, that the dielectric layer 112 is not a perfectly flat layer, however it is substantially-flat, especially considering that the view is at the nanometers level. In FIG. 3B, the dielectric layer 112 is curved and resembles a sigmoid or sigmoidal-shape. Hence, the dielectric 112 can also be referred to as a sigmoidal-shaped dielectric or a conformal dielectric layer or sigmoidal-shaped conformal dielectric layer. The reason for this is that the dielectric 112 is continuous and conforms to underlying surfaces because it is deposited as a liquid and flows to conform to those underlying layers during spin coating and then dries, hence the reason for an offset and what appears to be a non-uniform surface. In particular, the dielectric 112 conforms to the surfaces of the substrate 108 and first conductive layer 110 and, as shown in FIG. 3B, the sigmoid-shape occurs where the first portion 112A of the dielectric 112 transitions to the second portion 112B of the dielectric. The region where the first portion 112A transitions to the second portion 112B is referred to as a transition zone 112C where the dielectric layer 112 has a step jump to smoothly transition to the second portion. The first microstrip extension 116A smooth transitions from the second conductive layer 114 at the transition zone 112C. The dielectric 112 has a first side 115 and a second side 117. Thickness of the dielectric 112 is taken transverse, i.e. perpendicular to the first 115 and second 117 sides and remains substantially-constant and remains the same throughout, irrespective of whether it is the first portion 112A or the second portion 112B of the dielectric.

The RF witness film structures and array (100 and 601) can be individually addressed sensors that are wired, much like a printed circuit board, especially in the array 601 and system under test 600 embodiments. A person having ordinary skill in the art will recognize how the wiring is configured and, as such, wiring of each unit cell 100 in the array 601 is not show for ease of viewing.

Theory of Operation and Working Test Platform

The RF witness film 100 was conceived and physically-fabricated, i.e. constructed, to capture incident electromagnetic radiation, and localize the electric field from that radiation into an ultrathin capacitive structure. FIGS. 1A and 1B show a single unit cell that is expanded in the x-102 and y-104 directions. Thus, the RF witness film 100, sometimes referred to as a unit cell and other variations, as noted earlier, can also be referred to as an ultrathin capacitive structure.

The dielectric 112 thickness is sometimes referred to as a vertical gap, or gap for short, between the first and second conductive layers 110 and 114 and is used in place of a traditional in-plane gap to give fine control of gap separation. Electrical leads, generically shown in some figures for ease of viewing, were used to apply a DC offset voltage for electrical testing and to apply a DC offset voltage 118 to improve sensitivity of the RF witness film 100. The first conductive layer 110 and the second conductive layer 114, in conjunction with the first and second microstrip extensions 116A and 116B, form the capacitive structures. Since each unit cell, i.e. each RF witness film 100 is a capacitive structure, it is known where the capacitor is in the embodiments. The inductance can be equated to current through a wire creating a magnetic field. The longer path lengths essentially function as an inductor. Therefore, a person having ordinary skill in the art will understand that this is especially the case at the first and second overlap regions 122A and 122B due to the electron tunneling 302 described earlier.

FIG. 5 shows a simulated electric field distribution 500 on both the first and second conductive layers 110 and 114 in the unit cell 100 in FIG. 1B. A close-up view 502 showing a portion of the second conductive layer 114, fourth strip segment 110D of the first conductive layer 110, and second microstrip extension 116B is shown. In particular, the close-up view 502 shows the second overlap region 122B, the region where the greatest electric field distribution occurs. The electric field distribution in volts per meter is graphically shown in the chart 504 on the left of FIG. 5. In particular, it is evident that the greatest electric field distribution occurs at the second overlap region 122B due to electron tunneling 302. The electron tunneling 302 causes the concentration of the electric field distribution to be the highest at the second overlap region 122B from the second microstrip extension 116B and underneath and down to the first conductive layer 110. A person having ordinary skill in the art will describe this as fringing fields from the second microstrip 116B down and through the dielectric layer 112 and into the first conductive layer 110.

Although not shown in FIG. 5, the same conditions and results are expected at the first overlap region 122A. Additionally, the incident radiation built up charge on opposing sides of the capacitive gap (the dielectric layer 112), i.e. on both the first and second conductive layers 110 and 114. The opposing charge created a potential difference that drove electron tunneling across the dielectric layer 112.

Figure 6:
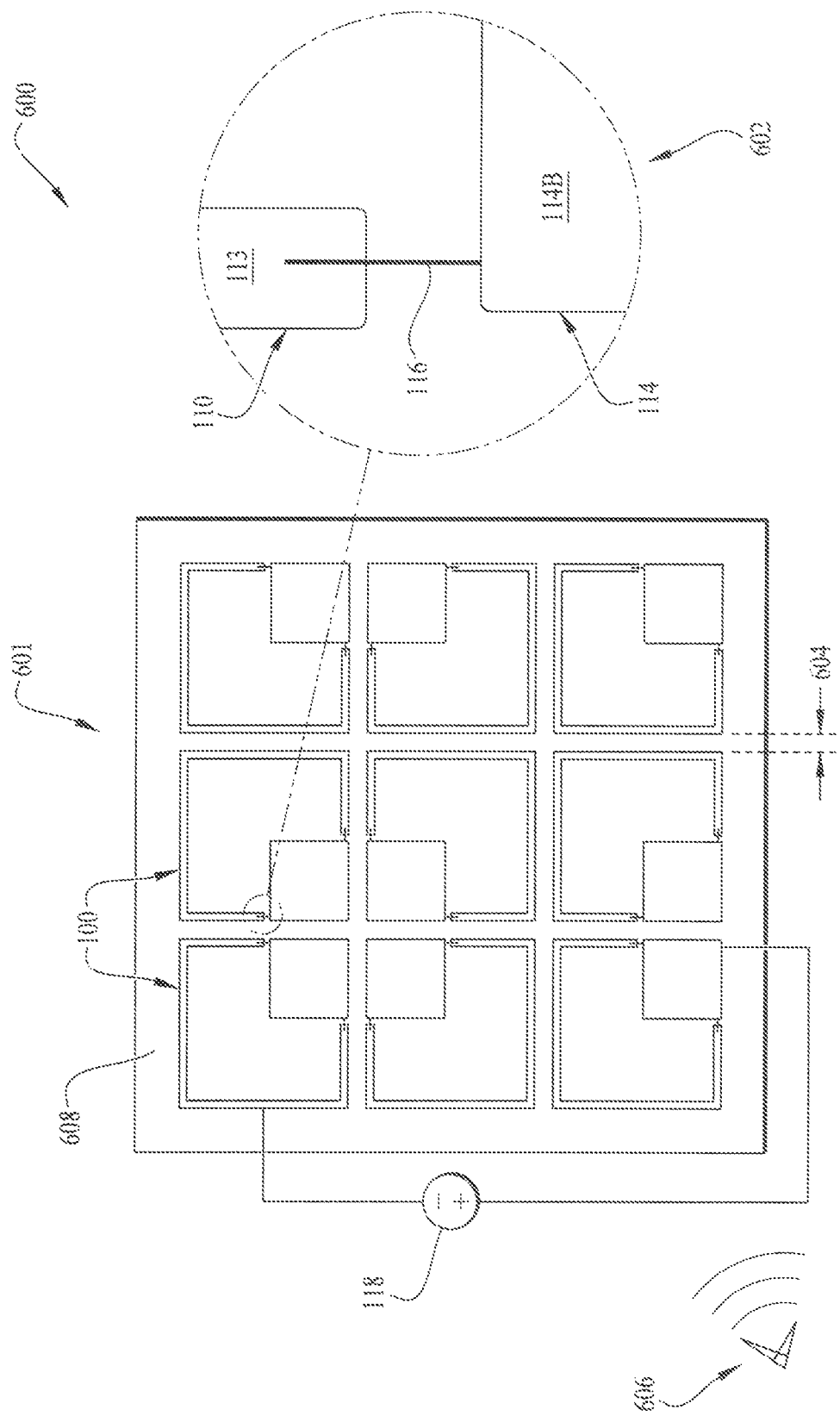
FIG. 6 illustrates a plan view of a system under test, including a constructed test array of RF witness films, according to some embodiments.

FIG. 6 illustrates a plan view of a system under test 600, including a constructed test array 601 of RF witness films 100. Notably, FIG. 6 is a working test system 600 and can also be referred to as a working test platform or system under test or simply system for short. The system under test 600, including the array 601 was fabricated in a solid state laboratory. The array 601 and each of the RF witness films 100 are constructed as shown and described in FIGS. 1A through 3B. Thus, unless stated otherwise with additional specificity, the embodiment shown in FIG. 6 is based on the preceding embodiments from FIGS. 1A and 1B. Deposition techniques for each individual RF witness film 100 in the array 601 were similar to those previously described.

The array 601 is in intimate adjacent contact with a substrate foundation 608. Additional substrate foundation 608 border is included on the outside edges of the array 601 to provide for stability during layer deposition and also additional structural rigidity necessary in a testing environment. The array 601 has a plurality of radio frequency (RF) witness films 100 overlain on the substrate foundation 608. Each of the RF witness films 100 is constructed as previously described. Each RF witness film 100 in the array, i.e. the plurality of RF witness films, is equally-spaced from adjacent RF witness films.

Each RF witness film 100 is configured to receive a direct current (DC) offset voltage 118 between the first conductive layer 110 and the second conductive layer 114. This provides a constant DC voltage for sensitivity adjustment of each RF witness film 100 in the array 601. For ease of viewing, only a single exaggerated electrical connection is shown for the DC offset voltage 118. It is understood that each RF witness film 100 in the array 601 is electrically-connected to the DC offset voltage 118. Specifically, it is understood that each first 110 and second 114 conductive layer in each RF witness film 100 is electrically-connected by wire to the DC offset voltage 118.

The system 600 was assembled for simulation and experimentation purposes. In particular, the system under test 600, was configured to recognize that a directed energy attack occurred, i.e. some form of radio frequency signals were propagated at the array 601. A person having ordinary skill in the art will understand that specific nomenclature for exactly which components are depicted, i.e. first of this or second of that, is based on orientation in the three-dimensional coordinate frame of reference. Therefore, in a close-up views 602, based on an optical microscope image, a single microstrip extension 116 is shown instead of determining whether the view depicts the first 116A or second 116B microstrip extension. The same applies with respect to both the first 110A and fourth 110D strip segments of the first conductive layer 110, which therefore is simply referred to as the "strip segment" and similar, such as "the strip segment of the first conductive layer." Additionally, the first conductive layer 110 is not shown with hidden lines and the dielectric layer 112 is not referenced in FIG. 6, even though it is understood to exist as in previous figures. These adaptations are for ease of viewing both FIG. 6 as a whole, including both the close-view 602 and in further discussion with respect to FIG. 9.

The array 601 is a three by three element array, i.e. nine unit cells 100. It is evident that a nearest neighbor gap distance 604 is consistently applied between each of the unit cells 100 in the army 601. A one millimeter space is maintained between metal constituents and the unit cell 100 boundary, i.e. the edge of an individual substrate 108, such as with an individual unit cell 100. This is maintained in the array 601, which allows for the nearest neighbor gap distance 604 to be two millimeters in the array in FIG. 6. The array 601 is polarization insensitive so that its orientation does not matter and can be turned and still yield the same results. The array 601 was optimized to enhance electric field incident on the array inside of the dielectric layer 112. Physically, the array 601 in FIG. 6, including the substrate foundation 608 shown is a four inch square in the x-102 and y-104 directions. The array 601 is a three dimensional configuration having an array period of 25 millimeters. It is understood that other size arrays 601, nearest neighbor gap distances 604, substrate foundation 608 sizes, and array periods can be employed based on application-specific conditions without detracting from the merits or generalities of the embodiments.

A high gain antenna 606, sometimes referred to as an antenna and, in particular, a horn antenna, was included in the system 600 to propagate RF signals at the array 601. The horn antenna 606 in FIG. 6 replicates a threat antenna. As such, the antenna 606 is often referred to as a threat antenna herein. A person having ordinary skill in the art will recognize that input power is provided to the antenna 606 and, for ease of viewing, is not shown in FIG. 6.

The DC offset voltage 118 heats the RF witness films to increase their sensitivity. The threat antenna 606 in FIG. 6 emulates a directed energy attack on the array 601 by radiating radio frequency signals in a range of 100 volts per meter to 450 volts per meter of electromagnetic radiation at the array. The threat antenna 606 imparts electromagnetic radiation (RF signals) at the array 601, which induces significant heat at the array 601, which is sometimes referred to as a "resistive heating." The resistive heating is the effect of high intensity radiation from the threat antenna 606 that is imparted to the array 601. The DC offset voltage 118 is varied to change the sensitivity of the RF witness films 100 as a way to adjust to the antenna's imparted electromagnetic radiation intensity. It should be noted that the heat provided by the DC offset voltage 118 is much lower than the resistive heating from the threat antenna 606. Adjusting the DC offset voltage 118 allows the array the individual RF witness films 100 in the array 601 to sense the electromagnetic energy intensity from the threat antenna 606.

For ease of viewing, FIG. 6 only shows a single electrical connection between the DC offset voltage 118 and the array 601. However, it is understood that each RF witness cell 100 in the array 601 is electrically-connected to the DC offset voltage 118 as shown in FIG. 1B. This allowed the DC offset voltage 118 to be applied between the first 110 and second 114 conductive layers of each RF witness cell 100 in the array 601. This allowed the current to be measured which flowed between the first 110 and second 114 conductive layers. When no electromagnetic radiation was incident on the array 601, no current was observed. The current was then monitored with varying DC offset voltages 118 and electric field strengths.

Figure 7:
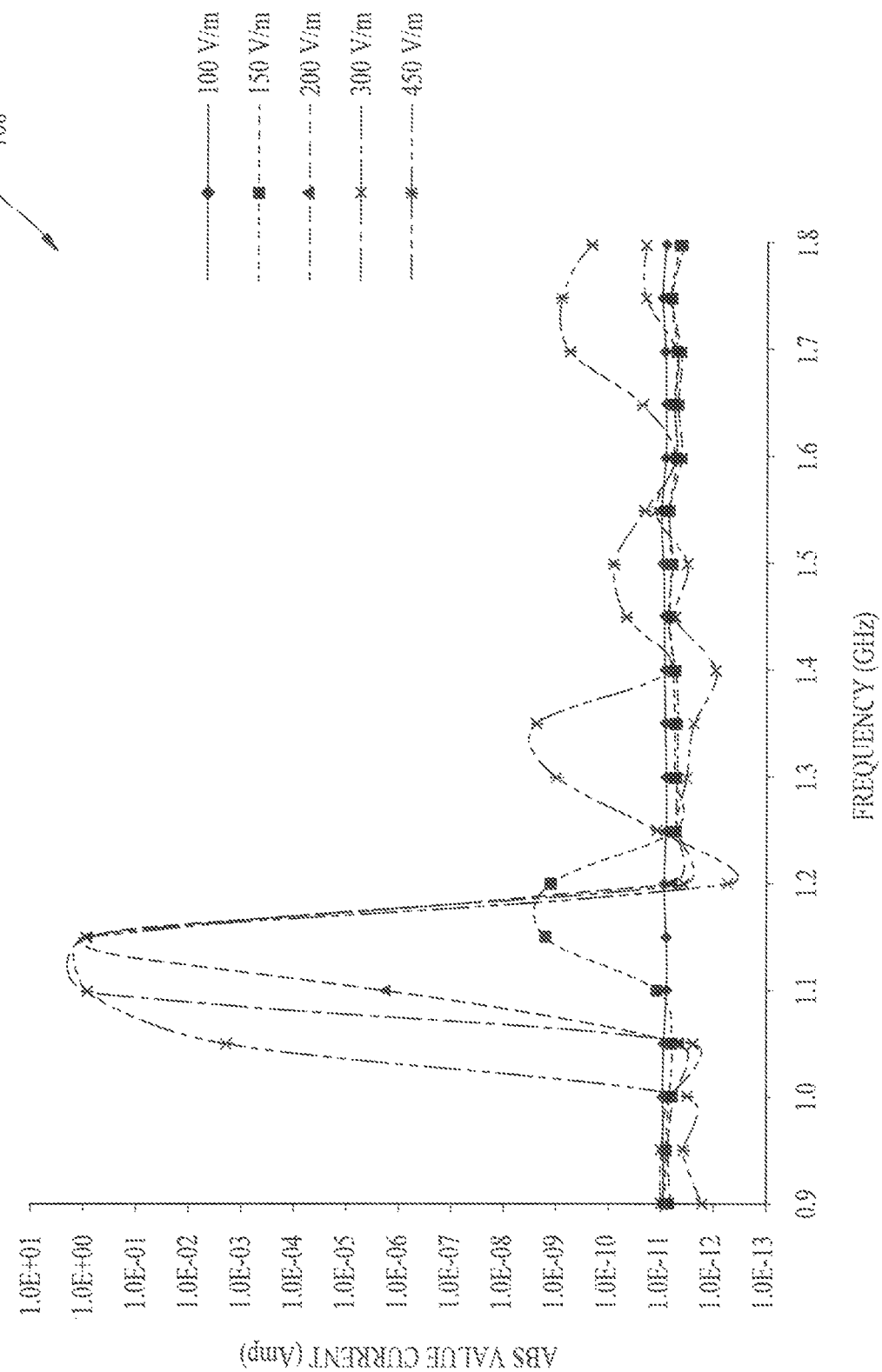
FIG. 7 illustrates a graphical depiction of the resulting tunneling current as a function of incident radiation frequency and field strength for the system under test in FIG. 6 at a 100 volts per meter DC offset voltage.

FIG. 7, depicted by reference character 700, shows the resulting tunneling current (y-axis) as a function of incident radiation frequency and field strength (x-axis) for the system under test 600 in FIG. 6 at a 100 volts per meter DC offset voltage during current data collection. FIG. 7 gives evidence of the reversible breakdown of the dielectric layer 112. The data was collected with a 100V DC offset voltage (reference character 118) and with the threat antenna 606 radiating a range of electromagnetic radiation at the array 601. Curves are shown in FIG. 7 for electromagnetic radiation from the threat antenna 606 at 100 volts per meter DC, 150 volts per meter DC, 200 volts per meter DC, 300 volts per meter DC, and 450 volts per meter DC, with the stand-off distance between the antenna 606 and the array 601 equal to one foot. At higher incident radiation electric field strength, the RF witness cells 100 in the array 601 experienced non-reversible breakdown.

Figure 8:
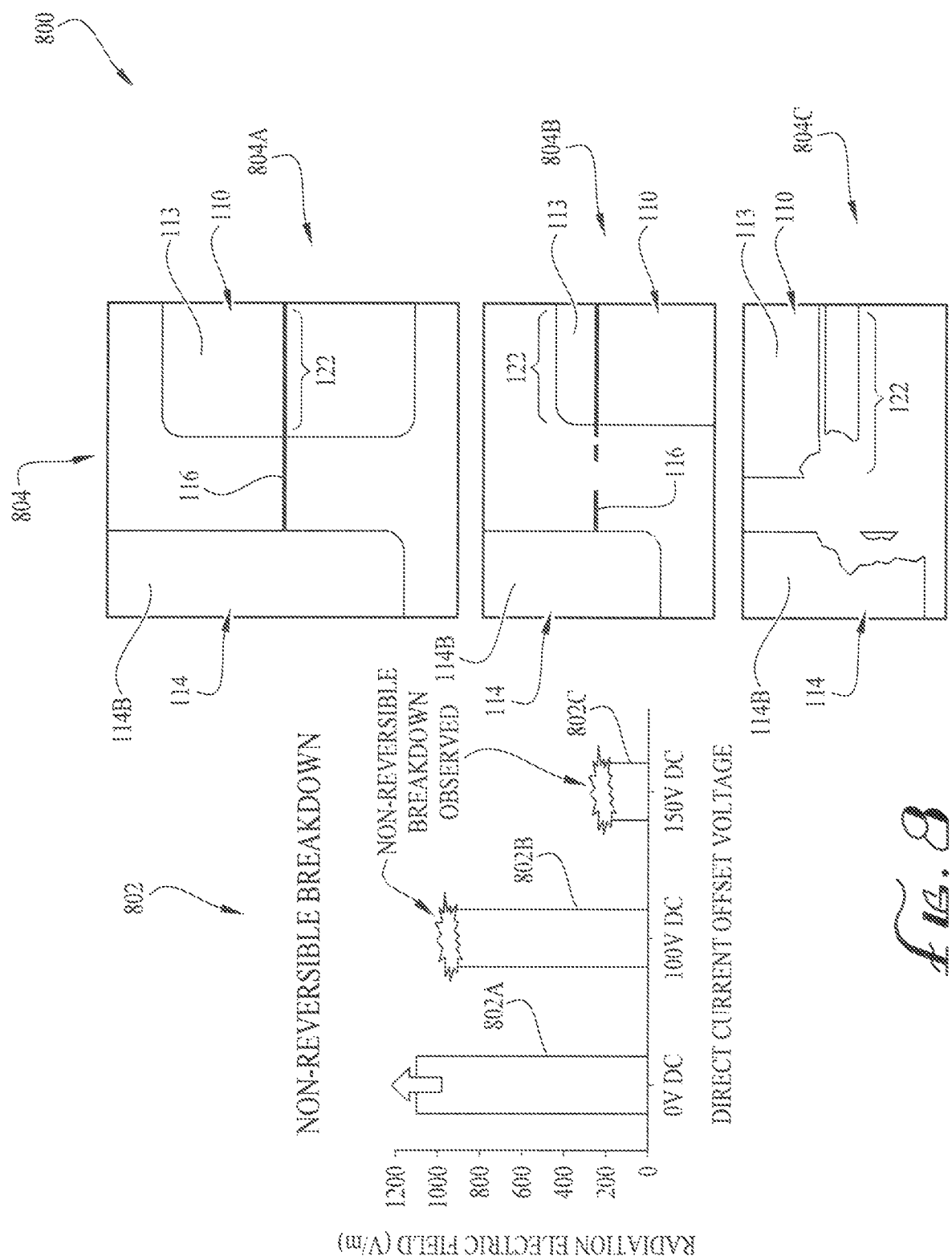
FIG. 8 depicts close-up views of non-reversible breakdown in the system under test from FIG. 6 and the incident electric field threshold for breakdown as a function of DC offset voltage.

FIG. 8, depicted with reference character 800, shows close-up views, depicted by reference character of non-reversible breakdown in the system under test 600 from FIG. 6 and the incident electric field threshold for breakdown. As shown on the left hand side of FIG. 8 by reference character 802, the DC offset 118 can be varied to change the sensitivity of the RF witness films 100 as an adjustment to the threat antenna 606 intensity. Three close-up views 804 on the right-hand side are originally from a microscope corresponding to the various DC offset voltages on the left hand side with reference character 802. Specifically, the three close-up views 804 are broken down with reference characters 804A, 804B, and 804C, and show varying stages of breakdown.

FIG. 8 simplifies components shown in the close-up views 802A, 802B, and 802C on the right hand side 804 for ease of viewing. The close-up views 802A, 802B, and 802C use similar nomenclature and simplified depictions of components for ease of viewing. Additionally, for the same reason, this also applies to the first 122A and second 122B overlap regions, which is generically shown as an overlap region 122. Additionally, the first conductive layer 110 is not shown with hidden lines and the dielectric layer 112 is not referenced in FIG. 8 to maintain consistency with FIG. 6 and to appropriately show the effects of conditions before and after breakdown.

Reference characters 802A and 804A depict the conditions before breakdown at 0V DC offset voltage at the strip segment of the first conductive layer 110 and the second conductive layer 114, respectively. It is also evident that the microstrip extension 116 is visible and remains intact. Additionally, the overlap region 122 is visible. There are no physical changes noted in the 0 V (zero volts) DC offset voltage environment 804A.

Reference characters 802B and 804B depict the conditions at 100V DC offset voltage, which results in non-reversible breakdown. Reference character 804B shows the second conductive layer 114 and the strip segment of the first conductive layer 110. The microstrip extension 116 is visible. It is evident that physical changes are present, especially in the microstrip extension 116, which is now in at least two pieces. Additionally, a portion of the microstrip extension 116 and possibly a portion of the strip segment of the first conductive layer 110 in the overlap region 122 may also be damaged.

Finally, reference characters 802C and 804C depict the conditions at 150V DC offset voltage, which also results in non-reversible breakdown. It is apparent that physical changes in the components are extreme here. Reference character 804C shows the second conductive layer 114 and the strip segment of the first conductive layer 110. The microstrip extension 116 appears to be completely destroyed in this view. Additionally, significant portions of the strip segment of the first conductive layer 110 are also missing due to the non-reversible breakdown. It appears significant portions of the overlap region 122 in the strip segment of the first conductive layer 110 are missing. For instance, a corner of the strip segment in the first conductive layer 110 appears to have a bite taken out of it. Likewise, it appears that there is damage to the strip segment in the first conductive layer 110, especially in the interior portion of it that would be directly below the microstrip extension 116 if the microstrip extension was still present. Finally, it is noticeable that the second conductive layer 114 is also damaged as if it also has had a bite taken out of it.

Thus, the non-reversible breakdown was marked by physical changes in the RF witness film 100 structure. The use of aluminum metal in the first and second conductive layers 110 and 114, respectively resulted in removal of material in the respective overlap regions. This is perfectly acceptable because FIG. 6 is a test system 600 and nicely illustrates the effects of the resistive breakdown in softer metals, such as aluminum. Thus, if something occurs, such as a directed energy impulse and it is evidenced by the RF witness film 100 or the entire array 601, then it allows a person having ordinary skill in the art to deduce that the occurrence happened at a particular frequency and power level. Notably, it is also possible to use a more refractory metal and evidence the non-reversible breakdown with a permanent defect being imprinted into the dielectric layer 112.

The electric field threshold for non-reversible breakdown (802B and 802C) was influenced by the offset voltage applied to the RF witness film 100. With no DC offset voltage 802A, non-reversible breakdown could not be achieved with the maximum 1100 V/m field strength possible with the system 600 used to test the array 601. With 100 V DC offset voltage 802B the breakdown occurred at 940 V/m electric field strength. Finally, with 150 V DC offset voltage 802C the RF witness film 100 suffered a non-reversible breakdown at 200 V/m electric field strength.

While the embodiments have been described, disclosed, illustrated and shown in various terms of certain embodiments or modifications which it has presumed in practice, the scope is not intended to be, nor should it be deemed to be, limited thereby and such other modifications or embodiments as may be suggested by the teachings herein are particularly reserved especially as they fall within the breadth and scope of the claims here appended.

What is claimed is:

1. A system, comprising:
    an array in intimate adjacent contact with a substrate foundation, said array having a plurality of radio frequency (RF) witness films overlain on said substrate foundation, each RF witness film in said plurality of RF witness films, comprising:
    a unit cell defined in a three-dimensional coordinate frame of reference defined by an x-axis, a y-axis, and a z-axis, said unit cell centered at an origin of said three-dimensional coordinate frame of reference, said unit cell, comprising:
    wherein each RF witness film in said plurality of RF witness films is equally-spaced from adjacent RF witness films;
    wherein each RF witness film in said plurality of RF witness films is configured to receive a direct current (DC) offset voltage.

2. The system according to claim 1, wherein said unit cell, further comprising:
    a first conductive layer in intimate adjacent contact with said substrate foundation;
    a dielectric layer having a first portion and a second portion, said first portion in intimate adjacent contact with said substrate foundation, said second portion in intimate adjacent contact with said first conductive layer; and
    a second conductive layer having a first side and a second side, said first side of said second conductive layer in intimate adjacent contact with said first portion of said dielectric layer;
    wherein said second conductive layer having at least two microstrip extensions perpendicular to each other in the x-y plane.

3. The system according to claim 2, wherein said DC offset voltage is applied to each RF witness film in said plurality of RF witness films between said first conductive layer and said second conductive layer.

4. The system according to claim 2, further comprising:
    wherein said first conductive layer having first, second, third, and fourth strip segments joined end-to-end and forming three-quarters of a square strip outline in the x-y plane, wherein each of said first, second, third, and fourth strip segments having a first side and a second side, each of said first side of said first, second, third, and fourth strip segments in intimate adjacent contact with said substrate foundation;
    wherein said first portion is defined by an area interior to said first, second, third, and fourth strip segments in the x-y plane, and between said substrate foundation and said first side of said second conductive layer parallel to said z-axis;
    wherein said second portion of said dielectric layer is defined by an area delineated by, and in intimate adjacent contact with, each of said second sides of said first, second, third, and fourth strip segments in the x-y plane, and spanning parallel to said z-axis to the z-axis elevation of said first side of said second conductive layer.

5. The system according to claim 4, further comprising:
    wherein each of said first, second, third, and fourth strip segments having a proximal end and a distal end, said distal end of said first strip segment is adjacent to said proximal end of said second strip segment, said distal end of said second strip segment is adjacent to said proximal end of said third strip segment, said distal end of said third strip segment is adjacent to said proximal end of said fourth strip segment;
    wherein said first and fourth strip segments are not adjacent to each other;
    wherein said second conductive layer and said at least two microstrip extensions forming one-quarter of a square strip in the x-y plane, wherein said three-quarters of a square strip outline and said one-quarter of a square strip forming a complete square strip outline in the x-y plane.

6. The system according to claim 5, further comprising:
    said first microstrip extension having a proximal end at said second conductive layer, and a distal end extending outwardly away from said second conductive layer parallel to said x-axis and said first strip segment;
    said second microstrip extension having a proximal end at said second conductive layer, and a distal end extending outwardly away from said second conductive layer parallel to said y-axis and said fourth strip segment;
    a first overlap region defined by the length, parallel to said x-axis, of said first microstrip extension between said proximal end of said first strip segment and said distal end of said first microstrip extension, and parallel to said z-axis from said first microstrip extension through said dielectric layer and through said first conductive layer, and terminating at said first side of said first strip segment of said first conductive layer; and
    a second overlap region defined by the length, parallel to said y-axis, of said second microstrip extension between said distal end of said fourth strip segment and said distal end of said second microstrip extension, and parallel to said z-axis from said second microstrip extension through said dielectric layer and through said first conductive layer, and terminating at said first side of said fourth strip segment of said first conductive layer.

7. The system according to claim 1, wherein each RF witness film in said plurality of RF witness films is a capacitive structure.

8. The system according to claim 1, wherein said array is a 3×3 array of RF witness films with an array period of 25 millimeters.

9. A radio frequency signals detection system, comprising:
- an array in intimate adjacent contact with a substrate foundation, said array having a plurality of radio frequency (RF) witness films overlain on said substrate foundation;
- wherein each RF witness film in said plurality of RF witness films is equally-spaced from adjacent RF witness films;
- wherein each RF witness film in said plurality of RF witness films is electrically-connected to a direct current (DC) offset voltage; and
- a horn antenna configured to radiate RF signals at said array.

10. The system according to claim 9, wherein each RF witness film in said plurality of RF witness films is a unit cell defined in a three-dimensional coordinate frame of reference defined by an x-axis, a y-axis, and a z-axis, said unit cell centered at an origin of said three-dimensional coordinate frame of reference, said unit cell, comprising:
- a first conductive layer in intimate adjacent contact with said substrate foundation;
- a dielectric layer having a first portion and a second portion, said first portion in intimate adjacent contact with said substrate foundation, said second portion in intimate adjacent contact with said first conductive layer; and
- a second conductive layer having a first side and a second side, said first side of said second conductive layer in intimate adjacent contact with said first portion of said dielectric layer,
- wherein said second conductive layer having at least two microstrip extensions perpendicular to each other in the x-y plane.

11. The system according to claim 10, wherein said DC offset voltage is electrically-connected to each RF witness film in said plurality of RF witness films between said first conductive layer and said second conductive layer, said DC offset voltage providing a constant DC voltage to each RF witness film in said plurality of RF witness films.

12. The system according to claim 10, further comprising:
- wherein said first conductive layer having first, second, third, and fourth strip segments joined end-to-end and forming three-quarters of a square strip outline in the x-y plane, wherein each of said first, second, third, and fourth strip segments having a first side and a second side, each of said first side of said first, second, third, and fourth strip segments in intimate adjacent contact with said substrate foundation;
- wherein said first portion is defined by an area interior to said first, second, third, and fourth strip segments in the x-y plane, and between said substrate foundation and said first side of said second conductive layer parallel to said z-axis;
- wherein said second portion of said dielectric layer is defined by an area delineated by, and in intimate adjacent contact with, each of said second sides of said first, second, third, and fourth strip segments in the x-y plane, and spanning parallel to said z-axis to the z-axis elevation of said first side of said second conductive layer.

13. The system according to claim 12, further comprising:
- wherein each of said first, second, third, and fourth strip segments having a proximal end and a distal end, said distal end of said first strip segment is adjacent to said proximal end of said second strip segment, said distal end of said second strip segment is adjacent to said proximal end of said third strip segment, said distal end of said third strip segment is adjacent to said proximal end of said fourth strip segment;
- wherein said first and fourth strip segments are not adjacent to each other,
- wherein said second conductive layer and said at least two microstrip extensions forming one-quarter of a square strip in the x-y plane, said three-quarters of a square strip outline and said one-quarter of a square strip forming a complete square strip outline in the x-y plane.

14. The system according to claim 13, further comprising:
- said first microstrip extension having a proximal end at said second conductive layer, and a distal end extending outwardly away from said second conductive layer parallel to said x-axis and said first strip segment;
- said second microstrip extension having a proximal end at said second conductive layer, and a distal end extending outwardly away from said second conductive layer parallel to said y-axis and said fourth strip segment;
- a first overlap region defined by the length, parallel to said x-axis, of said first microstrip extension between said proximal end of said first strip segment and said distal end of said first microstrip extension, and parallel to said z-axis from said first microstrip extension through said dielectric layer and through said first conductive layer, and terminating at said first side of said first strip segment of said first conductive layer; and
- a second overlap region defined by the length, parallel to said y-axis, of said second microstrip extension between said distal end of said fourth strip segment and said distal end of said second microstrip extension, and parallel to said z-axis from said second microstrip extension through said dielectric layer and through said first conductive layer, and terminating at said first side of said fourth strip segment of said first conductive layer.

15. The system according to claim 9, wherein each RF witness film in said plurality of RF witness films is a capacitive structure.

16. The system according to claim 9, wherein said array is a 3×3 array of RF witness films with an array period of 25 millimeters.

17. The system according to claim 9, wherein each RF witness film in said plurality of RF witness films is equally-spaced from adjacent RF witness films.

18. The system according to claim 9, wherein said horn antenna is configured to radiate said RF signals in a range of 100 volts per meter to 450 volts per meter at said array.

* * * * *